US011881275B2

(12) United States Patent
Cano et al.

(10) Patent No.: US 11,881,275 B2
(45) Date of Patent: *Jan. 23, 2024

(54) SCREENING OF MEMORY CIRCUITS

(71) Applicant: Texas Instruments Incorporated, Dallas, TX (US)

(72) Inventors: Francisco Adolfo Cano, Sugar Land, TX (US); Devanathan Varadarajan, Allen, TX (US); Anthony Martin Hill, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/148,312

(22) Filed: Dec. 29, 2022

(65) Prior Publication Data

US 2023/0146764 A1    May 11, 2023

Related U.S. Application Data

(63) Continuation of application No. 16/817,096, filed on Mar. 12, 2020, now Pat. No. 11,568,951.

(Continued)

(51) Int. Cl.
*G11C 29/00* (2006.01)
*G11C 29/38* (2006.01)
(Continued)

(52) U.S. Cl.
CPC .......... *G11C 29/38* (2013.01); *G11C 11/412* (2013.01); *G11C 11/418* (2013.01);
(Continued)

(58) Field of Classification Search
CPC .............. G11C 29/38; G11C 29/50004; G11C 2029/5004; G11C 11/412; G11C 11/418; G11C 11/419
See application file for complete search history.

(56) References Cited

U.S. PATENT DOCUMENTS 7,010,736 B1    3/2006  Teh et al.
8,614,921 B2 *  12/2013 Watanabe ........ G11C 29/50004
                                         365/185.21
(Continued)

FOREIGN PATENT DOCUMENTS

DE   102008022218    11/2008
WO   2011132352      10/2011

OTHER PUBLICATIONS

International Search Report for PCT/US2020/022534 dated Jun. 11, 2020.

(Continued)

*Primary Examiner* — Christine T. Tu
(74) *Attorney, Agent, or Firm* — Michael T. Gabrik; Frank D. Cimino

(57) ABSTRACT

Systems of screening memory cells of a memory include modulating bitline and/or wordline voltage. In a read operation, the wordline may be overdriven or underdriven with respect to a nominal operating voltage on the wordline. In a write operation, one or both of the bitline and wordline may be overdriven or underdriven with respect to corresponding a nominal operating voltage. Such a system has margin control circuitry, which may be in the form of bitline and wordline margin controls, to modulate bitline and wordline voltages, respectively, in the memory cells of the memory array.

16 Claims, 3 Drawing Sheets

Related U.S. Application Data

(60) Provisional application No. 62/955,516, filed on Dec. 31, 2019, provisional application No. 62/817,925, filed on Mar. 13, 2019.

(51) Int. Cl.
 *G11C 29/50* (2006.01)
 *G11C 11/419* (2006.01)
 *G11C 11/418* (2006.01)
 *G11C 11/412* (2006.01)

(52) U.S. Cl.
 CPC ...... *G11C 11/419* (2013.01); *G11C 29/50004* (2013.01); *G11C 2029/5004* (2013.01)

(56) References Cited

U.S. PATENT DOCUMENTS

| | | |
|---|---|---|
| 9,922,702 B1 | 3/2018 | Shanmugam et al. |
| 11,568,951 B2 * | 1/2023 | Cano ............... G11C 11/412 |
| 2010/0182859 A1 * | 7/2010 | Kohler ............... G11C 8/08 365/201 |
| 2012/0307579 A1 | 12/2012 | Huber et al. |
| 2015/0012237 A1 | 1/2015 | Balog et al. |
| 2015/0194207 A1 | 7/2015 | Lee et al. |
| 2015/0279462 A1 | 10/2015 | Lyer et al. |
| 2016/0232985 A1 | 8/2016 | Sabde et al. |
| 2016/0267965 A1 | 9/2016 | Kang |

OTHER PUBLICATIONS

Extended European Search Report for EU 20769337.5 dated Mar. 21, 2022.

* cited by examiner

SCREENING OF MEMORY CIRCUITS

This application claims priority to: (1) U.S. Provisional Application No. 62/817,925, filed Mar. 13, 2019; (2) U.S. Provisional Application No. 62/955,516, filed Dec. 31, 2019; and (3) U.S. Non-Provisional application Ser. No. 16/817,096, filed Mar. 12, 2020, all of which are incorporated herein by reference.

BACKGROUND

It may be helpful to screen memory devices so that the memory devices will perform reliably. Screening may involve testing memory devices in a less stable state with the assumption that if a device functions properly in the less stable state, it will also function properly in a stable state. A less stable state may be a state that is prone to disturbs. A less stable state may be achieved by placing the memory device under stress by, for example, varying temperature. Screening may provide an operational margin—that is, the less stable state under which the device should still function properly.

For memory devices comprising planar transistors—i.e., transistors with active drain and source portions planar with the oxide or insulator layer, screening may involve modulating the N-well to place the place the memory devices in a less stable state. Modulation, as used herein, means applying a higher or lower voltage as compared to a nominal operating voltage. Such a method, however, may not be available for memory devices using fin field-effect (FinFET) transistors, which have active drain and source portions that protrude above the oxide or insulator layer in a fin-like manner. The active drain and source portions of a FinFET transistor may not be impacted by changes to the N-well due to the distance between the active drain and source portions and the N-well in the FinFET transistor architecture.

SUMMARY

Illustrative examples described herein include a built-in self test (BIST) system for screening a memory array. The BIST system comprises a processor configured to execute instructions, including a read instruction directed to a memory cell of the memory array, wherein the memory cell has a nominal wordline voltage and the read instruction specifies a modulated wordline voltage that is different from the nominal wordline voltage; an address/data generator configured to be controlled by the processor to generate, based on the instructions, a set of addresses and a set of test data that includes an expected value for the memory cell; margin control circuitry configured to be controlled by the processor to provide the modulated wordline voltage to a wordline of the memory cell based on the read instruction; a write/read control generator configured to be controlled by the processor to read the memory cell to obtain a cell value using the modulated wordline voltage; and a comparator configured to compare the cell value to the expected value.

Illustrative examples described herein also include a built-in self test (BIST) system for screening a memory cell including a first bitline, a second bitline and a wordline. The BIST system comprises margin control circuitry configured to provide a modulated bitline voltage to at least one of the first bitline and the second bitline, wherein the modulated bitline voltage is different from a nominal bitline voltage of the memory cell; a write/read control generator configured to write a write value to the memory cell using the modulated bitline voltage, and read the memory cell to obtain a read value; a comparator configured to compare the read value to the write value; and a control engine coupled to, and configured to control, each of the margin control circuity, the write/read control generator, and the comparator.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections.

Figure 1:
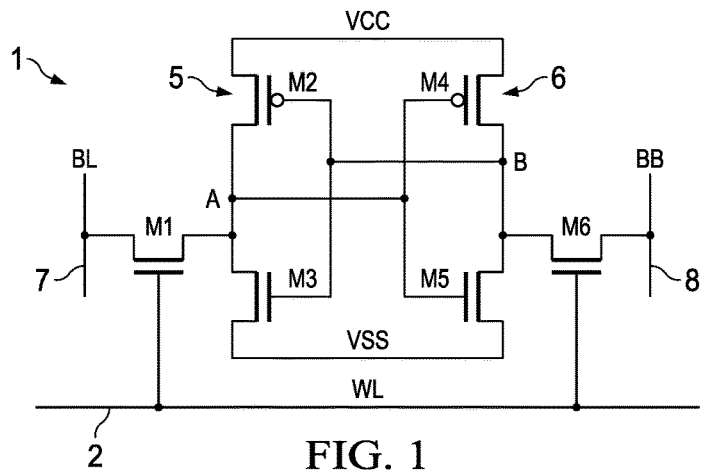
FIG. 1 shows an illustrative memory cell.

FIG. 1 shows an illustrative 6-transistor static random access memory (SRAM) memory cell 1 having transistors M1, M2, M3, M4, M5 and M6. Access transistor M1 couples a bitline BL 7 to a node A, and access transistor M6 couples a bitline BB 8 to a node B. Drain terminals of transistors M2 and M3 are coupled together at the node A. A source terminal of transistor M2 is coupled to a power source (for example, VCC) and a source terminal of transistor M3 is coupled to VSS (for example, ground). Drain terminals of transistors M4 and M5 are coupled together at the node B. A source terminal of transistor M4 is coupled to a power source (for example, VCC) and a source terminal of transistor M5 is coupled to VSS (for example, ground). Gate terminals of transistors M2 and M3 are coupled together and to the node B. Gate terminals of transistors M4 and M5 are coupled together and to the node A. Transistors M2 and M4 have N-wells 5 and 6, respectively. The gate terminals of access transistors M1 and M6 are coupled to a wordline WL 2. In the example of FIG. 1, transistors M2 and M4 comprise p-type metal oxide semiconductor field effect transistors (PMOS transistors) and transistors M1, M3, M5 and M6 comprise n-type metal oxide semiconductor field effect transistors (NMOS transistors). Other architectures of a memory cell may be implemented as well.

If transistors M1, M2, M3, M4, M5 and M6 are planar transistors, memory cell 1 may be screened by modulating the voltage on N-wells 5 and 6 to create margin. Such a method of screening, however, is not available if transistors M1, M2, M3, M4, M5 and M6 are FinFET transistors. The N-well region is typically on the opposite side of the transistor from the active portions, and in FinFET transistors the active portions extend away from the surface of the transistor opposite the N-well, and therefore farther from the N-well. In this way, the distance between the N-well region and active drain and source portions is greater in FinFET transistors than in planar transistors. As such, biasing the N-wells in FinFET transistors may not impact the active drain and source portions of the transistors as the electrons have too far to travel.

Figure 2:
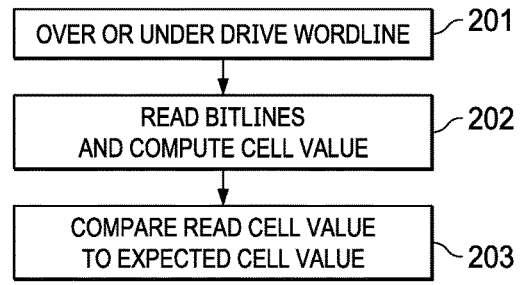
FIG. 2 shows an illustrative method for using a read instruction to screen the memory cell of FIG. 1.

FIG. 2 shows an illustrative method of screening the memory cell 1 during a read operation by modulating the voltage on the wordline WL 2, rather than the N-wells 5 and/or 6. The method of FIG. 2 may, therefore, be used for screening FinFET memory cells or planar memory cells. The screening method of FIG. 2 is performed, for example, at a factory as a quality check before a chip is used in the field.

At step 201, the wordline WL 2 is driven to a higher or lower voltage than a nominal operating voltage of the wordline WL 2. For example, the wordline WL 2 may be driven to +/−5% of the nominal operating voltage. At step 202, the bitlines BL 7 and BB 8 are read (for example, by a comparator) and the cell value is computed. For example, the value of the cell may be determined by calculating the difference between the voltage on the bitline BL 7 and the voltage on the bitline BB 8. At step 203, the computed cell value is compared to an expected cell value. If the values are the same, the cell passes screening having sufficient margin.

Figure 3:
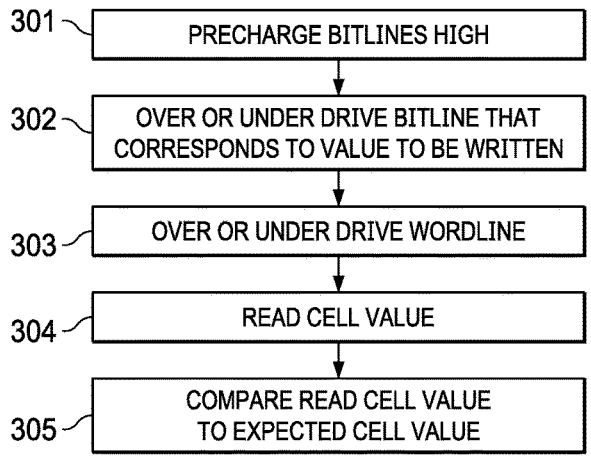
FIG. 3 shows an illustrative method for using a write instruction to screen the memory cell of FIG. 1.

FIG. 3 shows an illustrative method of screening the memory cell 1 during a write operation by modulating a voltage on a bitline BL 7 or BB 8 and/or wordline WL 2, rather than the N-wells 5 and/or 6. The method of FIG. 3 may, therefore, be used for screening FinFET memory cells or planar memory cells. The screening method of FIG. 3 is performed, for example, at a factory as a quality check before a chip is used in the field.

At step 301, the bitlines BL 7 and BB 8 are pre-charged high, for example to a nominal operating voltage of the bitlines BL 7 and BB 8. At step 302, the bitline BL 7 or BB 8 corresponding to the value to be written is driven to a higher or lower voltage than would typically be used for a write operation in the field. During a write operation, the bitline BL 7 may be driven low to write a "0" and the bitline BB 8 may be driven low to write a "1," or vice versa. The bitline BL 7 or BB 8 should be driven low enough to ensure that the corresponding access transistor M1 or M6 is able turn on the corresponding PMOS transistor M4 or M2. For example, if the bitline BL 7 or BB 8 is typically pulled down to 0 volts for a write operation, it may instead be driven to +/−100 mV. At step 303, the wordline WL 2 is driven to a higher or lower voltage than the nominal voltage of the wordline WL 2. For example, the wordline WL 2 may be driven to +/−5% of the nominal operating voltage.

At step 304 the memory cell 1 is read. The worldline WL 2 may optionally be over or under driven during step 304, as described in step 201 of FIG. 2. At step 305 the value read at step 304 is compared to the value written in steps 301-303. If the values are the same, the cell passes the screening having sufficient margin. While the method of FIG. 3 shows both the bitline BL 7 or BB 8 and the wordline WL 2 being over or under driven to place the cell into a less stable state, the method may alternatively involve over or under driving only the bitline BL 7 or BB 8 or only the wordline WL 2.

Figure 4:
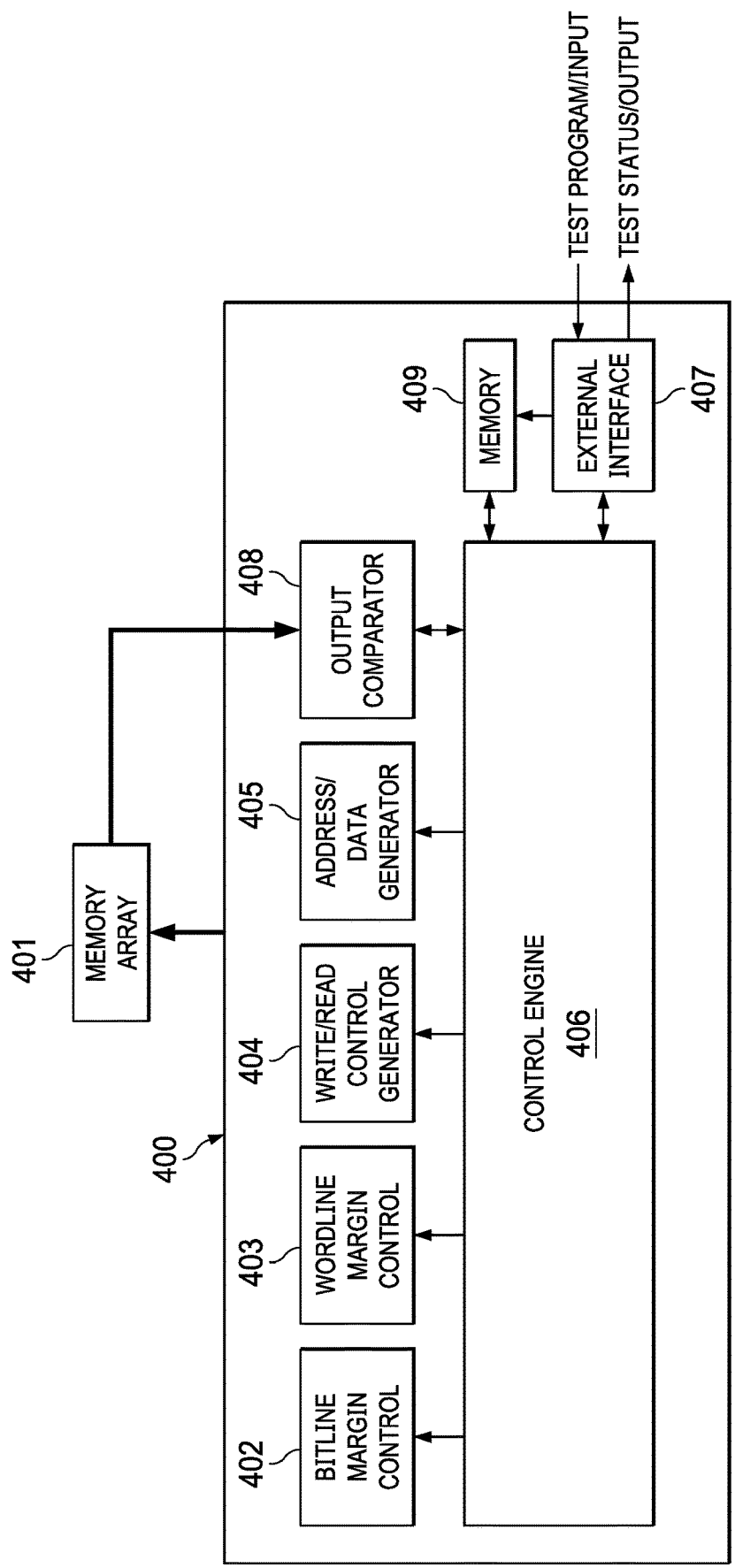
FIG. 4 shows an illustrative built-in self-test system.

FIG. 4 shows an illustrative diagram of a built-in self-test (BIST) system 400, which may be used in a factory before shipment of the chips to perform the methods of FIGS. 2 and/or 3 on memory cells in a memory array 401. Memory array 401 may be, for example, an SRAM memory array that comprises multiple memory cells like memory cell 1 of FIG. 1. BIST system 400 includes a control engine 406 coupled to a bitline margin control 402, a wordline margin control 403, a write/read control generator 404 and an address/data generator 405. Control engine 406 may be, for example, a processor or computer, and controls the operations of the other components of the BIST 400 based on, for example, software stored in memory 409. As described in more detail below, the software may include test programs that instruct the control engine 406 to test the memory array 401 by writing to and/or reading from individual cells of the memory array 401 using voltages that vary from a nominal operating voltage.

To that end, bitline margin control 402 may be a voltage biasing circuit and may provide a modulated voltage, as specified by the test program, on a bitline in memory array 401 (for example, bitline BL 7 and/or BB 8). Wordline margin control 403 may be a voltage biasing circuit and may provide a modulated voltage, as specified by the test program, to a wordline in memory array 401 (for example, wordline WL 2). Bitline margin control 402 and wordline margin control 403 may also be circuitry that provides control data to the memory array 401 to allow the memory array 401 to adjust the voltage on the bitline or wordline, respectively, based on the control data.

BIST system 400 also includes an output comparator 408 for receiving read data from the memory array 401 and comparing the data read to the data written to determine if the memory cells being tested have the expected values. If the values match, it may indicate that the respective cells have sufficient operating margin. BIST system 400 further includes an external interface 407 for receiving test programs and/or for outputting the results of a test program to, for example, an external computer.

Figure 5:
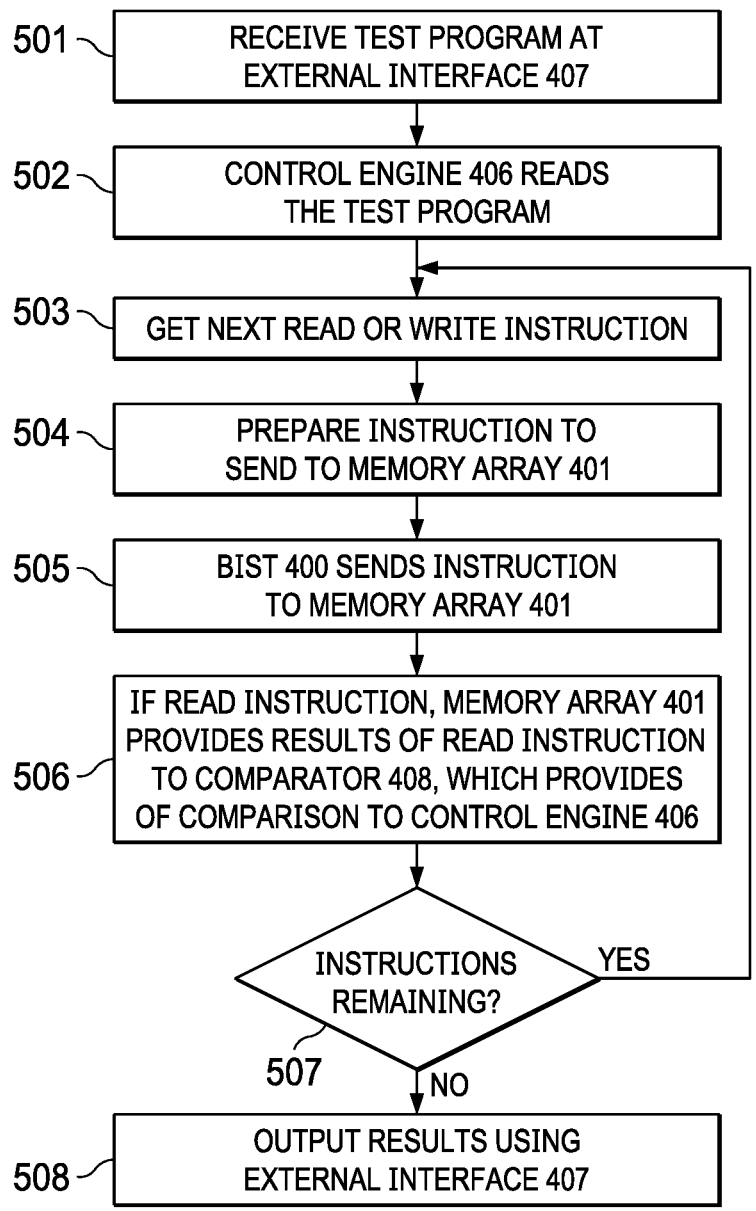
FIG. 5 shows an illustrative method of operating the built-in self-test system of FIG. 4.

FIG. 5 shows an example method of screening a cell or cells in memory array 401 using BIST system 400. The screening method of FIG. 5 is performed, for example, at a factory as a quality check before a memory array chip is used in the field. At step 501, a test program is received at the external interface 407 from, for example, an external computer. The external interface 407 may store the program, for example, in memory 409. The test program may be, for example, a series of write and/or read instructions according to the methods of FIGS. 2 and 3. For example, a write instruction may have the following format:

$$\text{Write}^{BL1}{}_{WL2}A0, D0$$

where Write identifies the instruction as a write instruction, D0 is the data to be written, and A0 is the address to which the data should be written. BL1 is a bitline voltage modulation value that specifies the voltage to be applied to the bitline during the course of the write operation. The bitline modulation value may specify the voltage by indicating the voltage directly, by indicating an offset from a nominal voltage specified elsewhere, or by other suitable means. Similarly, WL2 is a wordline voltage modulation value and may specify the voltage to be applied to the wordline during the course of the write operation by indicating the voltage directly, by indicating an offset from a nominal voltage specified elsewhere, or by other suitable means.

A sample read instruction may be:

$$\text{Read}_{WL2}A0$$

where Read identifies the instruction as a read instruction, A0 is the address from which the data should be read and WL2 is a wordline modulation value that specifies the voltage to be applied to the wordline during the course of the read operation. The wordline modulation value may specify the voltage by indicating the voltage directly, by indicating an offset from a nominal voltage specified elsewhere, or by other suitable means. The test program may contain instructions with voltage modulation values, such as those described above, interspersed with instructions for reads and/or writes to be performed at nominal voltages.

At step 502, the control engine 406 obtains the test program from memory 409. At step 503, the control engine 406 gets or reads the next instruction in the test program, which may be a read instruction or a write instruction with or without a voltage modulation value. The control engine 406 may get the first instruction if no other instructions have yet been processed.

At step 504, the control engine 406 prepares instructions and data to send to the memory array 401 to execute the instruction from the test program. This preparation may involve causing the address/data generator 405 to generate a sequence of addresses to be read from or written to based, for example, on the value A0 in the instruction from the test program. The addresses may correspond to some or all of the memory cells in the memory array 401 under test. As performance may have a spatial component, the addresses may correspond to a physical pattern, for example, a checkerboard pattern, a row stripe pattern, or a column stripe pattern, distributed over the memory cells of the memory array 401.

For a write instruction, the control engine 406 may cause the address/data generator 405 to generate test data to be written based, for example, on the value D0 in the instruction from the test program. The generated test data may be, for example, a series of 1s and 0s that is a binary representation of the value D0.

The control engine 406 may also cause the write/read control generator 404 to generate signals that cause the memory array 401 to carry out the corresponding write or read instruction for each address based, for example, on the instruction from the test program. These signals may include a write enable signal or read enable signal provided to a write enable input or read enable input, respectively, of the memory array 401. A read enable signal sent to a read enable input or a write enable signal sent to a write enable input may instruct the memory array to read to or write from, respectively, the memory array at the addresses provided to the memory array 401, for example through an address input in the memory array 401. The form of the instructions and data sent to the memory array 401 generally depends on the requirements of the memory array 401.

The control engine 406 may also instruct the bitline margin control 402 and/or wordline margin control 403 to modulate the voltage on a bitline and/or wordline based on, for example, the BL1 and WL2 values in the instruction from the test program. In the example where bitline margin control 402 and wordline margin control 403 are biasing circuits, bitline margin control 402 and/or wordline margin control 403 will generate the voltages based on the BL1 and WL2 values, respectively. In the example where bitline margin control 402 and wordline margin control 403 is circuitry that generates modulation control values, the bitline margin control 402 and/or wordline margin control 403 may generate a modulation control value that corresponds to BL1 and/or WL2, respectively, based on the requirements of the memory array 401. For example, the wordline margin control 403 may provide the memory array 401 a modulation control value of "0" to indicate a wordline voltage that is offset from a nominal voltage by 0 mV, a modulation control value of "1" to indicate a wordline voltage that is offset from a nominal voltage by 300 mV, and a modulation control value of "2" to indicate a wordline voltage that is offset from a nominal voltage by −300 mV. In another example, wherein the wordline margin control 403 specifies the wordline voltage directly, the wordline margin control 403 may provide the memory array 401 a modulation control value of "0" to indicate a read or write performed at a wordline voltage of 0 mV, a modulation control value of "1" to indicate a read or write performed at a wordline voltage of 300 mV, and a modulation control value of "2" to indicate a read or write performed at a wordline voltage of −300 mV.

At step 505, the BIST system 400 sends the read and/or write instructions generated in step 504 to the memory array 401. The instructions and/or data generated in step 504 may be sent to the BIST system 400 by the component that generated the respective instructions and/or data (for example, bitline margin control 402, a wordline margin control 403, a write/read control generator 404 and/or an address/data generator 405). In the case of a write instruction, the data generated in step 504 is written to the appropriate memory location in memory array 401. In the case of a read instruction, the cells at the specified address are read.

At step 506, if the instruction is a read instruction, memory array 401 outputs the read data to the output comparator 408. Output comparator 408 compares the results of the read instruction to the expected result, which may be stored in memory 409, to test whether the read data matches the expected result. The comparator 408 provides the result of the comparison to control engine 406. At step 507, the control engine 406 determines if any instructions remain in the test program that have not been executed. If so, the control engine 406 reads the next read or write instruction at step 503, and that instruction is processed in steps 504-506. If there are no instructions remaining in the test program, at step 508 the control engine 406 outputs the results of the test program at the external interface 407. Alternatively, the results of the test program may be output to the external interface 407 as they are generated and/or may be stored in memory 409.

Modifications are possible in the described embodiments, and other embodiments are possible, within the scope of the claims.

What is claimed is:

1. A built-in self test (BIST) system for screening a memory array, the BIST system comprising:
    a processor configured to execute instructions, including a read instruction directed to a memory cell of the memory array, wherein the memory cell has a nominal wordline voltage and the read instruction specifies a modulated wordline voltage that is different from the nominal wordline voltage;
    an address/data generator configured to be controlled by the processor to generate, based on the instructions, a set of addresses and a set of test data that includes an expected value for the memory cell;
    margin control circuitry configured to be controlled by the processor to provide the modulated wordline voltage to a wordline of the memory cell based on the read instruction;
    a write/read control generator configured to be controlled by the processor to read the memory cell to obtain a cell value using the modulated wordline voltage; and
    a comparator configured to compare the cell value to the expected value.

2. The BIST system of claim 1, wherein the memory cell includes a fin field-effect transistor.

3. The BIST system of claim 1, wherein the modulated wordline voltage is within +/−5% of the nominal wordline voltage.

4. The BIST system of claim 3, wherein the margin control circuitry includes a wordline margin control and a bitline margin control.

5. The BIST system of claim 4, wherein,
    the processor is further configured to execute a write instruction directed to the memory cell wherein, the memory cell has a nominal bitline voltage, and the write instruction specifies a modulated bitline voltage that is different from the nominal bitline voltage, the bitline margin control configured to provide the modulated bitline voltage to a bitline of the memory cell, and the read/write control generator further is configured to write the write value using the modulated bitline voltage.

6. The BIST system of claim 1, wherein:

the processor is further configured to execute a write instruction directed to the memory cell, wherein the modulated wordline voltage is a first modulated wordline voltage and the write instruction specifies a second modulated wordline voltage that is different from the nominal wordline voltage;

the margin control circuitry further configured to provide the second modulated wordline voltage to the wordline; and the read/write control generator further configured to write a write value to the memory cell using the second modulated wordline voltage.

7. The BIST system of claim 1, wherein:

the memory cell is a first memory cell of the memory array that further includes second through n memory cells, where n is a positive integer of 3 or more;

the processor is further configured to execute a read instruction directed to each of the second through n memory cells of the memory array, wherein each of the second through n memory cells has a nominal wordline voltage and the corresponding read instruction specifies a corresponding modulated wordline voltage that is different from the nominal wordline voltage of that memory cell;

the address/data generator is further configured to generate an expected value for each of the second through n memory cells;

the wordline margin control is further configured to provide a wordline of each of the second to nth memory cells, the corresponding modulated wordline voltage based on the corresponding read instruction;

the write/read control generator is further configured to obtain a cell value from each of the second through n memory cells using the corresponding modulated wordline voltage; and the comparator is further configured to compare each cell value of the second to n memory cells to the corresponding expected value.

8. A built-in self test (BIST) system for screening a memory cell including a first bitline, a second bitline and a wordline, the BIST system comprising:

margin control circuitry configured to provide a modulated bitline voltage to at least one of the first bitline and the second bitline, wherein the modulated bitline voltage is different from a nominal bitline voltage of the memory cell;

a write/read control generator configured to write a write value to the memory cell using the modulated bitline voltage, and read the memory cell to obtain a read value;

a comparator configured to compare the read value to the write value; and a control engine coupled to, and configured to control, each of the margin control circuitry, the write/read control generator, and the comparator.

9. The BIST system of claim 8, wherein the margin control circuitry is further configured to provide a modulated wordline voltage to the wordline, the modulated wordline voltage being different from a nominal wordline voltage of the memory cell.

10. The BIST system of claim 9, wherein the modulated wordline voltage is within +/−5% of the nominal wordline voltage.

11. The BIST system of claim 8, wherein the memory cell includes a fin field-effect transistor.

12. A non-transitory medium storing a test program that, when executed by a processor of a system causes the system to perform operations to screen memory cells in a memory array, the operations comprising:

executing read and write operations according to read and write instructions, each read instruction including an address from which data is to be read and a wordline modulation value specifying a wordline modulation voltage to be applied to a wordline of a target memory cell during a read operation, the wordline modulation voltage being different than a nominal wordline voltage of the memory cell, and each write instruction including an indication of data to be written, an address to which data is to be written, and a bitline modulation voltage to be applied to a bitline of a target memory cell during a write operation, the bitline modulation voltage being different than a nominal bitline voltage of the memory cell;

generating a sequence of addresses to be read from, or written to, based on the addresses in the read and write instructions and to generate test data to be written based on the write instructions;

generating signals that cause the memory array to carry out read and write instructions, as specified by the test program, including use of the modulated wordline voltage and use of the modulated bitline voltages; and comparing, for each read instruction executed, the read data responsive to that read instruction with an expected result.

13. The non-transitory medium of claim 12, wherein the modulated wordline voltage for a target memory cell is within +/−5% of the nominal wordline voltage for the target memory cell.

14. The non-transitory medium of claim 12, wherein each of the memory cells includes a fin field-effect transistor.

15. The non-transitory medium of claim 12, wherein the test program, when executed by the processor causes the system to perform further operations comprising:

executing a write instruction directed to the memory cell, wherein the modulated wordline voltage is a first modulated wordline voltage and the write instruction specifies a second modulated wordline voltage that is different from the nominal wordline voltage;

providing the second modulated wordline voltage to the wordline; and writing a write value to the memory cell using the second modulated wordline voltage.

16. The non-transitory medium of claim 12, wherein the test program, when executed by the processor causes the system to perform further operations comprising:

executing a write instruction directed to the memory cell, wherein the memory cell has a nominal bitline voltage, and the write instruction specifies a modulated bitline voltage that is different from the nominal bitline voltage; and providing the modulated bitline voltage to a bitline of the memory cell; and writing a write value to the memory cell using the modulated bitline voltage.

\* \* \* \* \*